United States Patent [19]

Darrow et al.

[11] 4,233,620
[45] Nov. 11, 1980

[54] SEALING OF INTEGRATED CIRCUIT MODULES

[75] Inventors: Russell E. Darrow, Newark Valley; Irving Memis, Vestal; Richard M. Poliak, Endwell, all of N.Y.

[73] Assignee: International Business Machines Corporation, Armonk, N.Y.

[21] Appl. No.: 16,034

[22] Filed: Feb. 27, 1979

[51] Int. Cl.³ .............................................. H01L 23/10
[52] U.S. Cl. .............................. 357/74; 260/37 EP; 528/93; 528/110; 357/72; 29/589
[58] Field of Search ............ 528/110, 93; 260/37 EP; 357/72, 74; 29/589

[56] References Cited

U.S. PATENT DOCUMENTS

| | | | |
|---|---|---|---|
| 3,311,589 | 3/1967 | Kohn et al. | 260/47 |
| 3,431,237 | 3/1969 | Harry | 260/47 |
| 3,784,583 | 1/1974 | Smith | 260/830 TW |

*Primary Examiner*—Earl A. Nielsen
*Attorney, Agent, or Firm*—Pollock, Vande Sande & Priddy

[57] ABSTRACT

The hermetic seal of the backside of a substrate of an integrated circuit module is provided by a composition containing about 51.4 to about 60.6% by weight of an epoxy polymer; about 39 to about 48% by weight of a hardener and flexibilizing portion; and up to about 0.6% by weight of a coloring agent.

22 Claims, 1 Drawing Figure

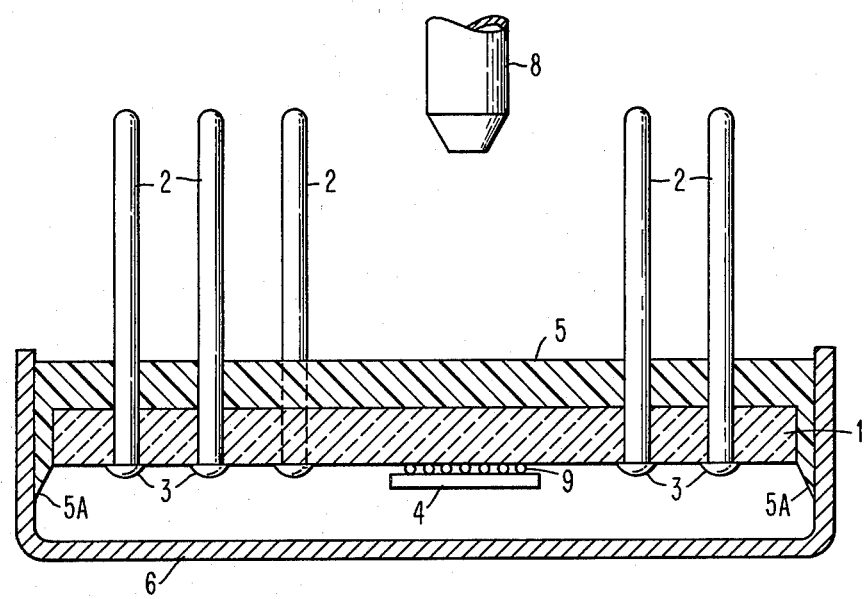

SEALING OF INTEGRATED CIRCUIT MODULES

DESCRIPTION

1. Technical Field

The present invention is concerned with an integrated circuit module wherein the backside of the substrate which contains the integrated circuit chip(s) is hermetically sealed to a cap by an improved epoxy composition, and to the improved composition. In addition, the present invention is concerned with the process for hermetically sealing the backside of the substrate of an integrated circuit module by employing certain epoxy compositions. The present invention is particularly concerned with those integrated circuit modules which contain a substrate having electrically-conductive pins protruding therefrom and having attached to the backside of the substrate at least one integrated circuit chip, and including a cap or container into which the substrate is placed with the backside thereof being covered by the bottom of the cap or container.

2. Background Art

During the preparation of integrated circuit modules, certain epoxy compositions have been employed to hermetically seal the backside of the substrate on which is attached at least one integrated circuit chip. Such compositions are employed to protect and seal the electrically active portions of the module.

In order for a composition to be commercially acceptable for sealing integrated circuit modules, it must possess a number of critical properties. In particular, the composition must be a nonconductor of electricity and must be capable of withstanding degradation due to exposure to various chemicals such as organic solvents and due to the effects of being exposed to the flow of electricity over extended periods of time. In addition, the composition must be resistant to reversion to nonfully cured products under adverse conditions of elevated temperature and high humidity over extended periods of time such as for at least about 10 years to be usable for integrated circuit packages to be employed in modern day computers. The compositions must also possess significant strength characteristics so as to resist deterioration when subjected to mechanical stresses. The compositions should also have good flexibility and be able to withstand thermal cycling (i.e., expansion and contraction due to temperature changes) without cracking. The compositions also must be resistant to permeation and diffusion of gases and solvents. Moreover, the composition must adhere tenaciously to the particular substrate employed.

A composition with ingredients containing about 47.6% by weight of a bisphenol A—epichlorohydrin epoxy polymer; about 52% by weight of a hardener and flexibilizer mixture and about 0.4% by weight of a coloring agent has been used. The hardener and flexibilizer mixture contains about 25 to 39% of hexahydrophthalic anhydride; about 50 to about 75% by weight of a polypropylene glycol and/or polyoxypropylene glycol flexibilizer; about 0.85 to about 1% by weight of a tertiary amine (e.g., trimethyl amine); and a minor amount of hexahydrophthalic acid resulting from hydrolysis of the corresponding anhydride.

The coloring agent employed is generally a mixture of chlorinated copper phthalocyanine on a titanium dioxide pigment.

This composition for the most part has been quite satisfactory for its intended purpose as a potting or encapsulating composition used to seal the backside of an integrated circuit module or package. For instance, the solvent resistance, electrical resistance, mechanical resistance, and reversion properties are commercially acceptable.

However, the flexibility of this composition is not entirely satisfactory. In addition, this commercially employed composition suffers from the disadvantage of insufficient resistance to cracking due to thermal cycling. When cracking occurs, substances in the surrounding environment (e.g., moisture) can come into contact with the backside of the module and cause problems such as corrosion of electrically active parts of the module resulting in reduced reliability. Accordingly, when cracking of the coating occurs, the module as such is not used. The cracking due to thermal stress became quite pronounced when the length of the sides of the modules was increased above 28 millimeters such as to about 36 millimeters. For instance, modules of 28 millimeters or less on a side have failures of about 1 to 4% due to thermal cracking when employing the above commercial composition. Failures in this range are commercially tolerable. However, upon increasing the substrate size to at least about 36 millimeters on a side, the failures increased to between 10 and 30% with the above compositions. These rates of failure are not commercially acceptable.

Accordingly, it is an object of the present invention to provide a sealing composition which is less susceptible to thermal stress cracking than the now commercially employed compositions discussed hereinabove. A further object of the present invention is to provide a sealing composition which is more flexible than the above-mentioned commercially employed epoxy composition. A major difficulty in overcoming these deficiencies and problems is not to cause a deterioration in the other essential properties for a sealant to be employed in the preparation of integrated circuits.

Surprisingly, the present invention provides for at least as good mechanical, electrical, and chemical resistances as achieved in the above-discussed commercially acceptable composition and at least as good if not better reversion properties while at the same time increasing the ability to withstand thermal cycling without cracking and increasing the flexibility.

The increased flexibility and increased ability to withstand thermal cycling are quite surprising since the present invention employs less of the hardener and flexibilizer mixture than is used in the above-discussed commercially employed composition.

Another problem experienced with the above-discussed commercially employed composition is referred to as "run-in." "Run-in" refers to the flow of the composition downward into the cap or can used to cover the backside of the substrate. This occurs at space gaps at the corners between the substrate which generally has a slightly rounded edge and the cap or can which are generally square. If the composition flows completely to the underside of the substrate, then problems in reliability could be caused by destruction of solder joints upon thermal expansion. This problem has been compensated for by closely fitting the cap or can to the substrate such as by crimping the cap or can.

The present invention significantly reduces, if not eliminates, this problem of run-in. The compositions of the present invention resist flow downward to an undesired extent to the bottom of the cap or can, while at the same time flowing vertically when dispensed to cover the entire substrate and contact the upstanding walls of the cap or can adjacent the substrate to form the seal. Accordingly, the use of the present invention makes it possible to tolerate larger gaps at the corners between the substrate and cap; and thereby, making it possible to use less crimping than previously required. Reduced crimping in turn reduces mechanical stress on the back seal compositions which are used to coat the integrated circuit chip.

DISCLOSURE OF THE INVENTION

The present invention is concerned with an integrated circuit module containing a substrate having electrically-conductive pins protruding therefrom, and having attached to the backside thereof at least one integrated circuit chip. The backside of the substrate is contained within a cap or can and is hermetically sealed thereto by a composition applied over the exposed surface of the substrate and over a portion of the height of the pins. The composition contains about 51.4 to about 60.6% by weight of an epoxy which consists essentially of a bisphenol A—epichlorohydrin epoxy polymer; about 39 to about 48% by weight of a hardener and flexibilizer portion; and up to about 0.6% by weight of a coloring agent. The bisphenol A—epichlorohydrin polymer has an epoxy equivalent weight of about 180 to about 210 and a viscosity of about 6,500 to about 22,500 centipoise at 25° C.

The hardener and flexibilizer portion contains about 15 to about 49% by weight of an anhydride hardener; about 40 to about 85% by weight of a polyalkylene glycol and/or a polyoxyalkylene glycol flexibilizer; up to about 1% of a tertiary amine catalyst for the epoxy; and minor amount of an acid resulting from the hydrolysis of the corresponding anhydride hardener. The maximum amount of the acid is such that the acid number of the hardener and flexibilizer portion does not exceed about 4.0 mg KOH/gram.

The polyalkylene glycols are polyoxyalkylene glycols having molecular weights so that the viscosity of the hardener and flexibilizer portion is about 900 to about 2500 centipoise at 25° C.

The present invention is also concerned with the above-discussed composition.

Furthermore, the present invention is concerned with a process for hermetically sealing the backside of the substrate of an integrated circuit module. The process includes providing a substrate having electrically-conductive pins protruding therefrom and having attached to the backside thereof at least one integrated circuit chip. The substrate with the chip attached thereto is placed into a cap or can wherein the backside of the substrate is covered by the cap or can. The composition discussed hereinabove is provided over the exposed surface of the substrate and a portion of the height of the pins and is then cured in order to hermetically seal the backside of the substrate within the gap or can.

The FIGURE is a schematic cross section of a module in accordance with the present invention.

The present invention is also generally discussed in IBM Technical Disclosure Bulletin, Volume 20, No. 10, March 1978, prepared on behalf of the inventors of this application. The disclosure of said IBM Technical Disclosure Bulletin is incorporated herein by reference.

BEST MODE FOR CARRYING OUT INVENTION

The epoxy polymers employed according to the present invention are diglycidyl ethers of bisphenol A—epichlorohydrin. The epoxy polymer component can also contain minor amounts (e.g., up to about 5% by weight) of other types of epoxides such as phenyl-glycidyl ether.

The epoxy polymers employed according to the present invention have an epoxy equivalent weight of about 180 to about 210 and should have a viscosity of about 6,500 to about 22,500 centipoise at 25° C. Some examples of epoxy polymers suitable for the present invention which are commercially available from Shell Oil include Epon 820, Epon 826, Epon 830, and Epon 828. Epon 828 is a diglycidyl ether of bisphenol A—epichlorohydrin having an epoxy equivalent weight of 185 to 192 and viscosity of 10,000 to 15,000 CPS at 25° C. Epon 820 is a mixture of Epon 828 with about 2 to about 5% by weight of phenyl glycidyl ether, and has an epoxy equivalent weight of 180 to 195 and a viscosity of 6,500 to 10,000 CPS at 25° C. Epon 826 is a diglycidyl ether of bisphenol A—epichlorohydrin having an epoxy equivalent weight of 180–188 and a viscosity of 6,500 to 9,500 CPS at 25° C. Epon 830 is a diglycidyl ether of bisphenol A—epichlorohydrin having an epoxy equivalent weight of 190 to 210 and a viscosity of 15,000 to 22,500 CPS at 25° C.

The hardener and flexibilizer portion of the composition includes an anhydride hardener or mixture of anhydrides for the epoxy, and a polyalkylene glycol and/or polyoxyalkylene glycol flexibilizer. The hardener and flexibilizer portion can also include a tertiary amine catalyst for the epoxy and minor amounts of acid(s) which can result from the hydrolysis of the corresponding anhydride(s). By including the above component in the hardener and flexibilizer portion, it is not intended to mean that these must be premixed together separately prior to admixing with the epoxy. These components have been recited in this manner so as to facilitate the calculations and disclosure with respect to the relative amounts of ingredients which must be employed.

The hardener is an anhydride such as nadic methyl anhydride and preferably a phthalic type anhydride such as hexahydrophthalic anhydride and tetrahydrophthalic anhydride. Mixtures of anhydrides can be employed if desired. The anhydride is present in amount of about 15 to about 49% by weight and preferably 25 to about 39% by weight based upon the weight of the total weight of the anhydride, flexibilizer, tertiary amine and acid in the hardener and flexibilizer portion of the composition.

The flexibilizer is a polyalkylene glycol or polyoxyalkylene glycol which can be represented by the formula:

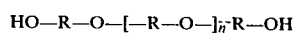

wherein R is a divalent saturated aliphatic hydrocarbon moiety selected from the group of ethylene, propylene, butylene and mixtures thereof. These groups can be straight or branched chained.

Mixtures of these glycols can be employed if desired. The n is 0 or an integer such that the molecular weight thereof in conjunction with the amount used is such that the viscosity of the hardener and flexibilizer portion is about 900 to about 2,500 centipoise at 25° C. Examples of some suitable glycols include polyethylene glycol, polypropylene glycol, polyoxyethyleneoxypropylene glycol, and polybutylene glycol. The preferred glycols are polypropylene glycol and polyoxypropylene glycol.

The glycol or glycols are present in amounts of about 40 to about 85% and preferably about 50 to about 75% by weight based upon the total weight of the hardener and flexibilizer portion of the composition.

A tertiary amine curing agent must also be employed. The preferred tertiary amines include the saturated aliphatic monoamines such as trimethyl amine and triethyl amine. The tertiary amine can be employed in amounts of 0.1 to about 1% and preferably about 0.85 to about 1% by weight based upon the total weight of the hardener and flexibilizer portion of the composition.

In addition, minor quantities of acid(s), e.g., up to about 1% or more based on the weight of the hardener and flexibilizer portion, might be present due to hydrolysis of the corresponding anhydride(s). The maximum amount of acid is such that the acid number of the hardener and flexibilizer portion not exceed about 4.0 mg KOH/gram.

The compositions can also include a coloring agent. Such is employed as a visual means to determine whether there is contamination of the composition on the parts of the pins which are not to be coated. The presence of the coloring agent also enhances inspection to determine whether the composition has adequately covered the substrate surface and joined to the cap or can.

The preferred coloring agents include the phthalocyanine dyes and most preferably are mixtures of chlorinated copper phthalocyanine (a green dye) and titanium dioxide pigment. Such is commercially available in the form of a mixture with a bisphenol A—epichlorohydrin epoxy polymer of the type employed in the present invention under the trade designation Hysol. The commercially available Hysol compositions contain about 20% by weight of the chlorinated or polychloro copper phthalocyanine and titanium dioxide mixture and about 80% by weight of the bisphenol A—epichlorohydrin epoxy resin (Shell Epon 828). Mixtures of coloring agents can be employed if desired.

If it is desired to provide a clear, transparent composition, then no coloring agent would be employed.

The compositions employed according to the present invention, in order to obtain the improved results discussed hereinabove without a concomitant deterioration in the other essential characteristics, must include the following relative amounts of components: about 51.4 to about 60.6% by weight of the epoxy constituent; about 39 to about 48% by weight of the hardener and flexibilizer portion; and up to about 0.6% and preferably about 0.4 to about 0.6% by weight of the coloring agent. The viscosity of the composition is about 1000 to about 1700 and preferably about 1300 to about 1700 centipoise at 40° C.

The substrate employed is preferably a ceramic substrate. A ceramic is a product or material manufactured by the action of heat on earthy raw materials. The preferred ceramic substrates include silicon oxides and silicates such as aluminum silicate, and aluminum oxides.

The substrate can include preformed holes through which input/output (I/O) pins can be inserted so as to protrude from one surface of the substrate for insertion into circuit cards or boards. The pins also protrude slightly from the other surface referred to as the backside so as to contact the circuitry on the backside which in turn connects to the integrated circuit chip mounted on the backside of the substrate. The chips can be mounted, for instance, by well-known solder techniques.

The present invention is particularly effective for substrates with dimensions along at least one edge thereof which is at least about 30 millimeters long. This is so since the problem of the above-discussed commercially employed sealing composition concerning cracking becomes significant when using substrates having at least one edge which is at least about 30 millimeters in length. This cracking problem experienced is not so significant when using smaller substrates such as those of about 1 square inch and about 28 millimeters on a side. Although cracking does occur with the smaller substrates, the frequency is significantly less than when employing, for instance, a 36 millimeter square substrate as discussed hereinabove. With the larger substrates, the frequency of cracking is at a level which is very unsatisfactory from a commercial viewpoint (e.g., about 10–30% failures). Use of the present invention brings the failure rate down to an acceptable level of 1 to 4%.

The pins of the module can be any of the input-output pins well known in the art and need not be discussed herein in any great detail. Examples of suitable pins are goldplated pins, and tin-lead solder coated pins. It has been observed that the compositions of the present invention as compared to the above-discussed commercially employed compositions, result in less film formation on the pins. This is especially helpful with respect to the goldplated pins.

The FIGURE illustrates a cross-section of a module of the present invention.

Numeral 1 illustrates the substrate through which pins 2 extend and protrude from the topside thereof. Numeral 3 represents the small portion of the pin protruding on the backside of the substrate for carrying current thereto. The integrated circuit chip such as a silicon or polycrystalline silicon chip is represented by numeral 4 and is attached to substrate 1 with solder 9. Numeral 5 represents the potting or encapsulating composition and the approximate level of acceptable "run-in" is shown by 5A. Numeral 6 represents the cap or can.

The cap or can is preferably a metal, for example, aluminum and is employed to protect the backside and especially the chip from mechanical damage. In addition, the metal cap facilitates cooling of the entire module in that heat is conducted thereby. The walls of the cap are closely toleranced with the dimensions of the substrate to provide a close fit. Once the chip is placed inside, the can can be crimped and the coating composition is applied which then adheres the substrate hermetically to the sides of the cap to thereby seal the backside from the surrounding environment. The upstanding walls 7 of the cap 6 are high enough so as the entire thickness of the substrate and the chip therebelow can fit inside the cap. As is well known, the cap includes stand offs (not shown) upon which the chip carrier (substrate) can rest to prevent the chip from contacting physically with the bottom of the inside of the cap. Numeral 8 represents a nozzle or needle for dispensing the composition.

The area of pins to be covered by the potting or encapsulating composition is generally referred to as the "stand-off" area of the pins. The encapsulating composition is applied to the module up to the "stand-off" area in order to protect and seal the electrically active portions of the module. The coating can be carried out by a liquid dispense coating technique with dispense needles placed above open areas of the substrate with the pins pointing upwards.

After the coating step, the composition is cured by the application of elevated temperatures. The compositions are generally cured at temperatures of about 100° to about 200° C. for about ½ to about 10 hours. Preferably the curing is a multistage curing process which includes curing at about 100° to about 120° C. from about 2 to about 4 hours and then curing at about 150° C. to about 200° C. for about 4 more hours. Such curing insures sufficient cross-link density to obtain the desired solvent resistance and other properties.

The pins when desired can be coated with solder between the curing steps or after the second curing step. A typical solder operation involves coating the pins with a soldering material such as a tin-lead (63-37 eutectic) in a bath at about 580° C. for a few hours. When a solder operation is employed, the pins are coated with conventional flux composition for the solder. Fluxing compositions act to prevent and remove oxides from the pins during the soldering operation.

In a typical product prepared according to the present invention, the ceramic is a square of about 1 inch to about 36 millimeters on each side and about 65 mils±5 mils thick. The sealant of the present invention is generally employed in thicknesses of about 10 to about 35 mils. The clearance between the integrated circuit chip or wafer and bottom of the cap is about 60 mils.

The following nonlimiting examples are presented to further illustrate the present invention.

EXAMPLE I

Onto 40 ceramic 36 millimeter modules in a cell is dispensed by liquid dispensing a composition having a viscosity of about 1350 CPS at 40° C. containing about 50 parts by weight of a diglycidyl ether of bisphenol A and epichlorohydrin having an epoxy equivalent weight of 185 to 192 and a viscosity at 25° C. of 10,000-15,000 CPS available under the trade designation Epon 828; about 48 parts by weight of a hardener and flexibilizer portion obtained from the 3M Company and containing 25 to 39% by weight of hexahydrophthalic anhydride; 50 to 75% by weight of polyoxypropylene glycol, 0.85-1% by weight of tertiary amine; and minor amounts of hexahydrophthalic acid resulting from the hydrolysis of the hexahydrophthalic anhydride wherein the hardener and flexibilizer portion has a viscosity of about 900 to 2550 CPS at 25° C. and an acid number of 3.8±0.2 mg KOH/gram; and about 2% by weight of a green coloring agent portion available under the trade designation Hysol, about 80% of which is Epon 828 and about 20% of which is chlorinated copper phthalocyamine dye on a titanium dioxide pigment carrier.

The coating thickness about 35 mils. The composition is at 55°±5° C. during dispensing and the module surface is at about 100° C. during dispensing. The dispensing takes about 10 minutes. The temperature of the coating is raised immediately to about 120° C. over a 20 minute period starting at 90° C. due to contact with the substrate, and is maintained at about 120° C. for about 20 minutes for gelation to occur.

The coating is then cured by heating at about 100° C. for 4 hours, followed by heating at about 150° C. for another 4 hours.

EXAMPLE II

Example I is repeated with the same composition from the same batch of material. The difference being that the crimping step prior to coating is somewhat different.

EXAMPLE III

Example I is repeated except that the coating composition employs the same batch of material but in the relative amounts currently commercially employed, and in particular employs about 46 percent by weight of Epon 828, about 52 percent by weight of the hardener and flexibilizer portion and about 2% by weight of the coloring agent portion (Hysol). The composition has a viscosity of 1030 CPS at 40° C.

EXAMPLE IV

Comparison Example III is repeated except that the crimping step prior to coating is the one employed in Example II.

TESTING OF EXAMPLES I-IV

The 40 modules in each of the above examples are tested for reliability by being placed in a central chamber and subjected to thermal stress cycling from 0°-100° C. for 300 cycles, 3 cycles per hour. The modules are tested before and after thermal stress exposure for seal integrity by leak testing. With respect to examples I and II no leakage of modules was observed. On the other hand 5 modules prepared in accordance with Example III leaked and 1 module prepared in accordance with Example IV leaked. Also none of the modules of Example II cracked and only 2 of Exampe I cracked. However, 8 modules from Example III and 8 modules from Example IV cracked.

EXAMPLE V

Modules coated by the process of Example I with a composition having the same relative amounts of Epon 828, hardener and flexibilizer portion, and Hysol coloring agent (80% of which is also Epon 828) as employed in Example I are tested for resistance to reversion at 96° C. and 95% relative humidity and at 85° C. and 95% relative humidity. The time for failure at 95° C. is 138 days and the time for failure at 85° C. is greater than 214 days.

COMPARISON EXAMPLE VI

Example 5 is repeated except that the relative amounts of the ingredients are the same as the current commercially employed composition. The time for failure at 90° C. is 131 days and at 85° C. is greater than 214 days.

The Shore D hardness of the coating of this example is about 79; whereas, that for Example V is slightly less at about 77.

EXAMPLE VII

Example V is repeated except that the composition contains about 53% by weight of Epon 828, about 45% by weight of the hardener and flexibilizer portion and about 2% by weight of the coloring agent portion, 80% of which is Epon 828. Therefore the total Epon 828 is about 54.6%. The results obtained are similar to those from Example V. The hardness is about 72.

EXAMPLE VIII

Example V is repeated except that the composition contains about 58% by weight of Epon 828, about 40% by weight of the hardener and flexibilizer portion and about 2% by weight of the coloring agent portion, 80% of which is Epon 828. The total Epon 828 content therefore being about 59.6% by weight. The results obtained are similar to those of Example V.

EXAMPLE IX

Example V is repeated except that the composition contains about 59% by weight of Epon 828, about 39% by weight of the hardener and flexibilizer portion and about 2% by weight of the coloring agent portion, 80% of which is Epon 828. The total Epon 828 content therefore is about 60.6% by weight. The results obtained are similar to those of Example 5.

In addition, modules prepared in accordance with Examples V-IX are tested for water permeation at 125°±2° C. in saturated water vapor for 130 hours. The coatings of the present invention and that currently commercially employed have about the same water permeation properties.

We claim:

1. An integrated circuit module containing a substrate having electrically-conductive pins protruding therefrom, and having attached to the backside thereof at least one integrated circuit chip wherein the improvement comprises providing a hermetical seal of the backside of the substrate contained within a cap with a composition over the substrate and a portion of the height of the pins containing:
    (A) about 51.4 to about 60.6% by weight of an epoxy of at least about 95% of which being a diglycidyl ether of bisphenol A and epichlorohydrin, having an epoxy equivalent weight of about 180 to about 210 and a viscosity of about 6,500 to about 22,500 centipoise at 25° C.;
    (B) about 39 to about 48% by weight of a hardener and flexibilizer portion containing
        (1) about 15 to about 49% by weight of an anhydride hardener for said epoxy wherein said anhydride is selected from the group of nadic methyl anhydride, hexahydrophthalic anhydride, tetrahydrophthalic anhydride or mixtures thereof;
        (2) about 40 to about 85% by weight of a polyglycol flexibilizer represented by the formula:

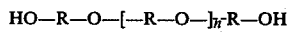

HO—R—O—[—R—O—]$_n$—R—OH wherein R is a divalent saturated aliphatic hydrocarbon moiety selected from the group of ethylene, propylene, butylene, and mixtures thereof; and wherein n is 0 or an integer such that the molecular weight of said flexibilizer in conjunction with the amount employed is such that the viscosity of the hardener and flexibilizer portion is about 900 to about 2500 centipoise at 25° C.;
        (3) 0.1 to about 1% by weight of a tertiary amine curing agent for the epoxy; and
        (4) 0 to minor amounts of acid resulting from hydrolysis of said anhydride; wherein said minor amount is such that the acid number of the hardener and flexibilizer portion does not exceed about 4.0 mg KOH/gram; and wherein the amounts of B(1), B(2) and B(3) and B(4) are based upon the total of B(1), B(2), B(3) and B(4) of the hardener and flexibilizer portion; and
    (C) 0 to about 0.6% by weight of a coloring agent.

2. The module of claim 1 wherein said epoxy is essentially a diglycidyl ether of bisphenol A and epichlorohydrin.

3. The module of claim 1 wherein said hardener and flexibilizer portion contains about 25 to about 39% by weight of said hardener; and about 50 to about 75% by weight of said polyglycol flexibilizer.

4. The module of claim 3 wherein said hardener and flexibilizer portion contains about 0.85 to about 1% by weight of a tertiary amine curing agent.

5. The module of claim 1 wherein said hardener is a phthalic anhydride.

6. The module of claim 1 wherein said hardener is hexahydrophthalic anhydride.

7. The module of claim 1 or claim 6 wherein said polyglycol is a polyoxypropylene glycol or mixture of polyoxypropylene glycols.

8. The module of claim 7 wherein said amine is trimethyl amine.

9. The integrated circuit module of claim 1 wherein said coloring agent is employed in amounts from about 0.4 to about 0.6% by weight.

10. The integrated circuit module of claim 1 wherein said substrate is at least about 30 millimeters along at least one edge thereof.

11. The integrated circuit module of claim 1 wherein said substrate is at least about 36 millimeters along at least one edge thereof.

12. The integrated circuit module of claim 1 wherein said substrate is a ceramic.

13. The integrated circuit module of claim 1 wherein said cap is a metal.

14. The integrated circuit module of claim 1 wherein said cap is aluminum.

15. The integrated circuit module of claim 1 wherein said pins are solder coated pins or goldplated pins.

16. The integrated circuit module of claim 9 wherein said coloring agent includes a copper phthalocyanine dye.

17. The module of claim 9 wherein said coloring agent is a chlorinated copper phthalocyanine dye mixed with titanium dioxide.

18. The integrated circuit module of claim 1 wherein said composition contains about 51.6% by weight of a bisphenol A—epichlorohydrin polymer; about 48% by weight of said hardener and flexibilizer portion and about 0.4% by weight of a coloring agent.

19. The integrated circuit module of claim 1 wherein said composition contains about 54.6% by weight of a bisphenol A—epichlorohydrin epoxy polymer; about 45% by weight of said hardener and flexibilizer portion and about 0.4% by weight of a coloring agent.

20. The integrated circuit module of claim 1 wherein said composition contains about 60.6% by weight of a bisphenol A—epichlorohydrin polymer; about 39% by weight of said hardener and flexibilizer portion and about 0.4% by weight of a dye.

21. A sealing composition consisting essentially of
    (A) about 51.4 to about 60.6% by weight of an epoxy at least about 95% of which being a diglycidyl ether of bisphenol A and epichlorohydrin, having an epoxy equivalent weight of about 180 to about 210 and a viscosity of about 6,500 to about 22,500 centipoise at 25° C.;

(B) about 39 to about 48% by weight of a hardener and flexibilizer portion containing
(1) about 15 to about 49% by weight of an anhydride hardener for said epoxy wherein said anhydride is selected from the group of nadic anhydride, tetrahydrohexahydrophthalic anhydride, tetrahydrophthalic anhydride or mixtures thereof;
(2) about 40 to about 85% by weight of a polyglycol flexibilizer represented by the formula:

HO-R-O-[-R-O-]$_n$R-OH wherein R is a divalent saturated aliphatic hydrocarbon moiety selected from the group of ethylene, propylene, butylene, and mixtures thereof; and wherein n is 0 or an integer such that the molecular weight of said flexibilizer in conjunction with the amount employed is such that the viscosity of the hardener and flexibilizer portion is about 900 to about 2500 centipoise at 25° C.;
(3) 0.1 to about 1% by weight of a tertiary amine curing agent for the epoxy; and
(4) 0 to minor amounts of acid resulting from hydrolysis of said anhydride; wherein said minor amount is such that the acid number of the hardener and flexibilizer portion does not exceed about 4.0 mg KOH/gram; and wherein the amounts of B(1), B(2), B(3) and B(4) are based upon the total of B(1), B(2), B(3) and B(4) of the hardener and flexibilizer portion; and
(C) 0 to about 0.6% by weight of a coloring agent.

22. A process for hermetically sealing the backside of the substrate of an integrated circuit module which comprises:
(A) providing a substrate having electrically-conductive pins protruding therefrom; and having attached to the backside thereof at least one integrated circuit chip;
(B) placing said substrate into a cap wherein the backside of said substrate is covered by said cap;
(C) providing a composition over the exposed surface of the substrate and a portion of the height of the pins wherein said composition contains
(1) about 51.4 to about 60.6% by weight of an epoxy at least about 95% of which being a diglycidyl ether of bisphenol A and epichlorohydrin, having an epoxy equivalent weight of about 180 to about 210 and a viscosity of about 6,500 to about 22,500 centipoise at 25° C.;
(2) about 39 to about 48% by weight of a hardener and flexibilizer portion containing
(a) about 15 to about 49% by weight of an anhydride hardener for said epoxy wherein said anhydride is selected from the group of nadic anhydride, tetrahydrohexahydrophthalic anhydride, tetrahydrophthalic anhydride, or mixtures thereof;
(b) about 40 to about 85% by weight of a polyglycol flexibilizer represented by the formula:

HO—R—O—[—R—O—]$_n$R—OH wherein R is a divalent saturated aliphatic hydrocarbon moiety selected from the group of ethylene, propylene, butylene, and mixtures thereof; and wherein n is 0 or an integer such that the molecular weight of said flexibilizer in conjunction with the amount employed is such that the viscosity of the hardener and flexibilizer portion is about 900 to about 2500 centipoise at 25° C.;
(c) 0.1 to about 1% by weight of a tertiary amine curing agent for the epoxy; and
(d) 0 to minor amounts of acid resulting from hydrolysis of said anhydride; wherein said minor amount is such that the acid number of the hardener and flexibilizer portion does not exceed about 4.0 mg KOH/gram; and wherein the amounts of 2(a), 2(b), 2(c) and 2(d) are based upon the total of 2(a), 2(b), 2(c) and 2(d) of the hardener and flexibilizer portion; and
(3) 0 to about 0.6% by weight of a coloring agent; and
(D) curing said composition to hermetically seal the backside of said substrate within said cap.

* * * * *

UNITED STATES PATENT AND TRADEMARK OFFICE
CERTIFICATE OF CORRECTION

PATENT NO. : 4,233,620
DATED : November 11, 1980
INVENTOR(S) : Darrow et al

It is certified that error appears in the above—identified patent and that said Letters Patent is hereby corrected as shown below:

Column 7, line 57, insert --is-- between the words "thickness" and "about".

Signed and Sealed this

Twenty-seventh Day of October 1981

[SEAL]

Attest:

GERALD J. MOSSINGHOFF

Attesting Officer     Commissioner of Patents and Trademarks